(12) United States Patent
Gordon et al.

(10) Patent No.: US 6,188,071 B1
(45) Date of Patent: Feb. 13, 2001

(54) FEEDBACK METHOD FOR INCREASING STABILITY OF ELECTRON BEAMS

(75) Inventors: Michael Gordon, Lincolndale; Scott Messick, Pleasant Valley; Chris Robinson, Hyde Park; James Rockrohr, Hopewell Junction, all of NY (US)

(73) Assignee: Nikon Corporation, Tokyo (JP)

(*) Notice: Under 35 U.S.C. 154(b), the term of this patent shall be extended for 0 days.

(21) Appl. No.: 09/132,533

(22) Filed: Aug. 11, 1998

(51) Int. Cl.$^7$ .................................................. H01J 37/14
(52) U.S. Cl. ...................................... 250/397; 250/356 ML
(58) Field of Search ............................ 250/396 R, 396 ML, 250/397, 398, 492.2

(56) References Cited

U.S. PATENT DOCUMENTS

| | | | |
|---|---|---|---|
| 3,558,878 | * | 1/1971 | Neuhaus .................................. 250/310 |
| 4,631,537 | * | 12/1986 | Neuner et al. ..................... 340/870.17 |
| 4,663,592 | * | 5/1987 | Yamaguchi et al. .................. 324/315 |
| 5,506,482 | * | 4/1996 | Teramatsu et al. .................... 315/382 |
| 5,635,719 | * | 6/1997 | Petric ............................. 250/396 ML |

* cited by examiner

Primary Examiner—Bruce C. Anderson
(74) Attorney, Agent, or Firm—McGuireWoods, LLP

(57) ABSTRACT

Temperature dependency on magnetic field strength of an electron optical element in an electron beam system due to variation of permeability with temperature of a ferromagnetic pole piece subject to radiant heating from another electron optical element is corrected by measurement of pole piece temperature and closed loop control of excitation current of a correction element which may be provided as a portion of a lens, stigmator, deflector or the like. A correction function may be computed to extrapolate correction values from empirically determined correction values or correction values may be retrieved from a memory such as a look-up table. Performance of the electron beam system is improved and constraints on choice of pole piece materials, mounting geometry, relative positioning of electron optical column elements and electron optical column length are relaxed since temperature dependencies of many electron optical elements can be corrected.

25 Claims, 1 Drawing Sheet

FEEDBACK METHOD FOR INCREASING STABILITY OF ELECTRON BEAMS

BACKGROUND OF THE INVENTION

1. Field of the Invention

The present invention generally relates to electron beam lithography tools and, more particularly, to limiting temperature-dependent changes in performance and operation of electron beam lithography tools.

2. Description of the Prior Art

Numerous lithography techniques are known and are in widespread use for manufacture of integrated circuit devices, in particular. Essentially, such lithography processes define potentially very minute areas and shapes on a surface through selective exposure and removal of portions of a layer of resist to expose areas of the surface for further processing by, for example, etching, implantation and/or deposition. Exposure has generally been accomplished in the past by use of radiant energy such as visible wavelength light.

There is a strong incentive in the manufacture of integrated circuits to increase integration density to the greatest possible degree consistent with acceptable manufacturing yields. Device arrays of increased density provide increased performance since signal propagation time is reduced with reduced connection length and capacitance. Further, increased device density on a chip allows greater chip functionality as well as greater numbers of devices which can be manufactured on a chip of a given area. Accordingly, increased integration density reduces manufacturing costs by maximizing the number of devices (or the number of chips of a particular functionality) which can be formed in the course of processing a single wafer of a given size since, for a given processing schedule, the cost of processing each wafer (including amortization and maintenance of the tools and processing reactor vessels) is substantially constant regardless of the number of devices or chips simultaneously formed.

Unfortunately, device size and density is a function of the minimum feature size which can be reliably produced in the course of patterning the resist. Minimum feature size is limited by the resolution of the exposure which is, in turn, limited by the wavelength of the exposure radiation. Accordingly, while deep ultraviolet (DUV) steppers now use 248 nm or 193 nm radiation, it is common to print features at sub-wavelength resolution. For example, 180 nm and 150 nm features can be exposed using 248 nm and 193 nm sources, respectively, by using a combination of small numerical aperture, off-axis illumination and optical proximity correction schemes. At shorter wavelengths of light, however, transmission becomes a problem requiring an entirely new class of optics to extend the present capabilities of optical lithography.

Similar severe difficulties exist for extending x-ray lithography to feature dimensions less than 130 nm. Although the wavelength of x-rays is sufficiently short (on the order of nanometers) to resolve feature sizes below 100 nm, x-ray lithography relies on using defect-free masks of the same size (1x) as the features to be exposed and thus relies on the perfecting of mask-making technology and shrinking the mask-wafer gap to reduce error due to diffraction. Such masks have been made utilizing electron beam lithography machines.

To form feature sizes in accordance with design rules incorporating sub-one-tenth micron region and below, it has been necessary to perform resist exposures with charged particle beams. Electron beams (e-beams) are favored since particles of the low mass of an electron can be more readily manipulated (e.g. accelerated, focused, guided and the like) at lower power levels preferably using magnetic lenses, correctors, deflectors and the like. Accordingly, while the invention will be discussed below in connection with an electron beam tool, it is to be understood that all such references are intended to be inclusive of tools using any charged particle species (e.g. ions as well as electrons). By the same token, the principles discussed herein are also applicable to other charged particle beam devices including control of a charged particle beam such as electron microscopy devices and references to an e-beam tool should be understood as inclusive of such other charged particle devices.

When charged particles are in close proximity to one another, such as at a cross-over in the optical system, the resolution of the beam can be degraded by the Stochastic Coulomb interaction. The interaction is dependent on the numerical aperture, beam current and drift space of the charged particles. The numerical aperture is a trade-off between the geometric aberrations (which increase with increase of numerical aperture) and the Coulomb interaction (which decreases with increase of numerical aperture). The beam current is determined by both the throughput requirement of the tool for a given resist sensitivity and the resolution loss through the Coulomb interaction (which increases with increasing current). Finally, Coulomb interactions are reduced for short drift spaces, particularly in the region where the size of the beam is small such as near the focal plane.

Practical implementation of shortening of the electron beam column is often difficult to achieve. There are often mechanical constraints in the location of magnetic lenses, correction elements, deflection and alignment yokes and the like. U.S. Pat. No. 5,635,719, which is hereby fully incorporated by reference, discusses the difficulties presented by a shortened electron-optical column on deflection fields when lens fields overlap in an electron beam projection lithography tool. Additional complications arise due to heat transfer between magnetic lenses, deflection yokes and correction elements which are in close proximity.

Practical implementation of electron beam lithography tools generally include magnetic lenses comprised of windings of several thousand ampere turns with a steel enclosure and pole pieces made of steel, permador, ferrite or other suitable ferromagnetic material used to concentrate the field of the lens. The lens windings can be significant sources of heat and are often liquid-cooled to reduce radiant heat exchange to other column elements. Depending on the pole piece material and its temperature/permeability characteristics, the strength of a magnetic lens, for a given excitation current, can be dependent on pole piece temperature resulting in variations in beam focus and/or position. Non-axially-symmetric thermal expansion may lead to large astigmatism.

In the past, cooling the lens windings removed enough heat to keep the pole piece temperature nearly constant. However, in modern, high-performance e-beam tools, it is often the case that significant sources of heat can occur near a lens pole piece by, for example, the windings of a deflection or compensation yoke of the type described in the above-incorporated U.S. Pat. No. 5,635,719. The pole pieces are relatively more remote from the cooling arrangement of the lens than the windings and the standard cooling arrangement is thus somewhat less efficient in regulating the temperature of the lens pole piece. Further, depending on the pole piece mounting geometry, the effective position of the lens or other element can shift with temperature, causing variations in beam position below the element, astigmatism and/or focus changes of the beam.

It should be appreciated that focus, astigmatism and beam position become more critical with the reduction of the minimum feature size written because the overlay and critical dimension variation specifications are all typically more stringent with reduction of feature size. Electron beam projection systems which are to be capable of writing minimum feature sizes of less than 0.13 microns will have specifications similar to the next generation of tools for fabricating x-ray masks. While it is known to liquid-cool deflection yokes and thus limit heat radiated to pole pieces of other elements such as lenses, the criticality of focus, astigmatism and beam position at smaller feature size regimes has been found to require a degree of temperature control which is not possible with known liquid cooling arrangements, particularly if temperature dependence is strong. The expense of developing a liquid cooling system providing greater temperature control than is available from known systems is considered to be prohibitive and, in any event, would only provide a marginal improvement which would rapidly become obsolete as further reductions in minimum feature sizes are made in integrated circuit designs.

Electrical correction for temperature-dependent performance variations has not been feasible since the inductance and hysteresis in the lens is sufficiently large to prevent real-time adjustments in lens excitation in response to changes in pole piece temperature. Accordingly, it can be appreciated that temperature-dependent changes of e-beam tool performance are a major impediment to the increase of integration density and for which no solution currently exists.

Conversely, it the absence of a capability of correction for temperature-dependent performance variations severe design constraints are placed on the design of magnetic optical elements such as material choice and liquid cooling arrangements in order to minimize temperature dependent effects. These constraints severely complicate e-beam tool design and limit the reduction of charged particle column length which, in turn, limits performance of charged particle beam tools.

SUMMARY OF THE INVENTION

It is therefore an object of the present invention to provide a methodology and arrangement for providing real-time correction of temperature-dependent changes of lens performance in regard to focus, astigmatism, beam position and the like of a charged particle beam system.

It is another object of the invention to provide improved flexibility in design of e-beam tools to enhance performance thereof.

In order to accomplish these and other objects of the invention, a charged particle beam system is provided including a magnetic element having a pole piece for controlling a charged particle beam, a temperature sensor located proximate to the pole piece, an arrangement such as a processor, difference amplifier or a look-up table for deriving a correction of a nominal value of excitation current for said magnetic element, and an arrangement for applying a corrected excitation current to the magnetic element or additional correction element which can be excited appropriately to compensate for temperature effects in the original magnetic element.

In accordance with another aspect of the invention, a method of operating a charged particle beam system is provided comprising steps of measuring temperature of a pole piece, and correcting a nominal excitation current of the charged particle beam system in accordance with a correction value corresponding to the measured temperature.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
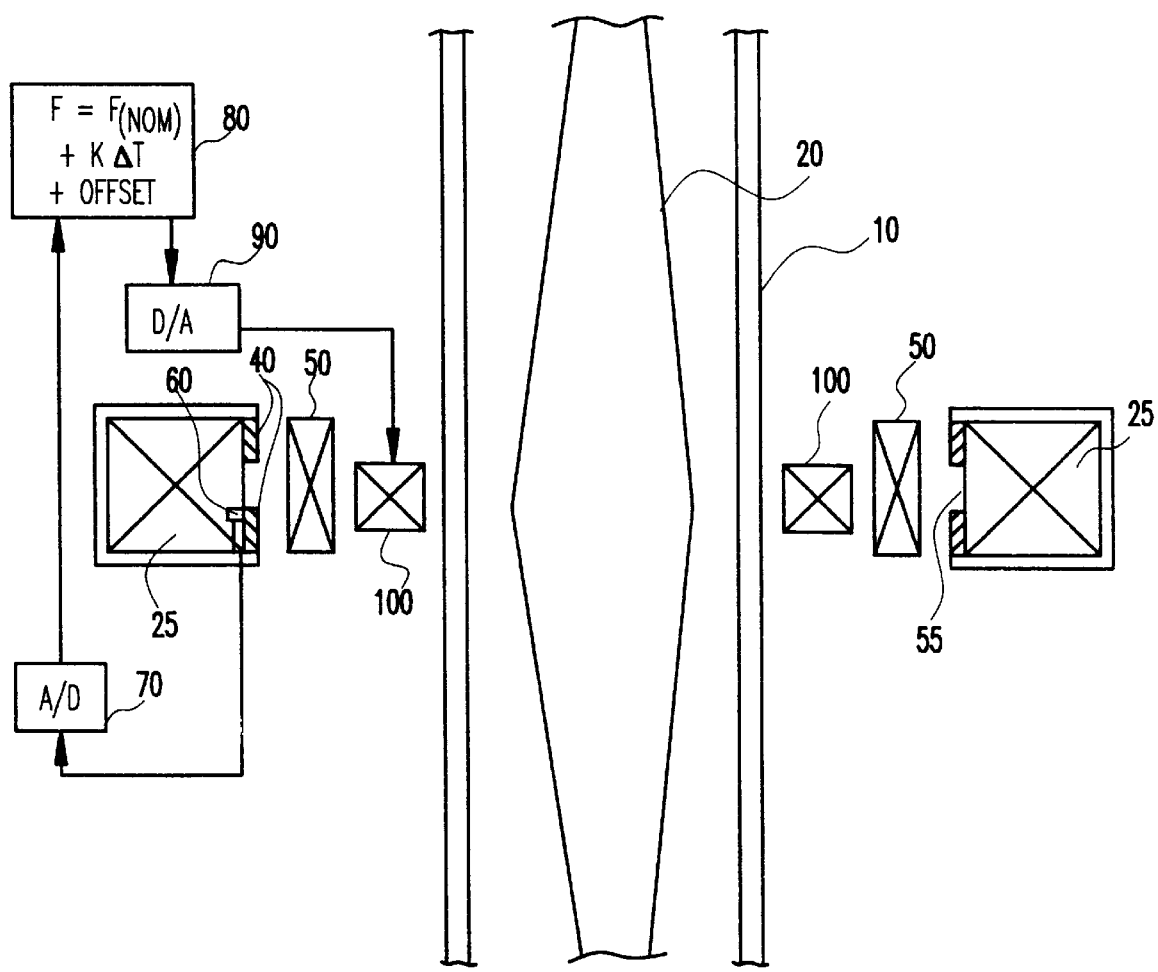
FIG. 1 is a schematic diagram of a portion of the electron optical column of a charged particle beam tool including the invention.

Referring now to the drawings, and more particularly to FIG. 1, there is schematically shown, in a sectional side view, an arbitrary portion of an electron optical column of a charged particle beam system at the location of two closely spaced electron optical elements between which significant heat transfer can occur. It should be understood that the invention can be applied to any optical element of such a system for which some degree of resistive heating and resulting temperature variation could occur. The invention will be explained, however, in regard to a focus adjustment/correction coil 100 and lens 25, having pole piece 40 and a deflection coil 50 mounted concentrically inside the lens 25 and in close proximity to pole piece 40.

It should be recognized that the deflection yoke 50 does not need to be in the same axial position as the lens 25 either as a matter of design of the electron optical column or for the problem of radiant heating to occur. The invention, however, is particularly effective for compensating for the temperature dependent effects of such a configuration and, by the same token, temperature excursions of deflectors and surrounding elements are particularly large since deflection currents in deflector 50 may vary widely to obtain the desired beam deflections while temperature dependent effects on focus are critical in e-beam projection lithography tools.

For reference, a beam tube 10 and electron beam 20 are illustrated in FIG. 1. The presence of the beam tube is not important to the practice of the invention and is intended as being exemplary of an enclosure which can be evacuated to provide a suitable environment for the charged particle beam 20 and, for purposes of illustration of the invention, a convenient indicator of the boundary of the region in which charged particles in the beam may exist. Focus coil 100, lens 25, pole piece 40 and deflector 50 are placed closely around the beam tube 10. It can be appreciated from the depiction of FIG. 1 that significant heat transfer can occur from deflector 50 to pole pieces 40 and the rate of heat transfer will vary with the temperature differential between the deflector 50 and the pole pieces 40. However, excitation current and resistive self-heating of the lens 25 will be substantially constant and temperature variation of the pole pieces 40 can be considered as a function of temperature variation of deflector 50 since the heat output from focus coil 100 will be negligible.

However, it should be appreciated that since the pole pieces 40 have significant thermal mass there will be a delay in temperature change of the pole pieces 40 in comparison with temperature changes in deflector 50. Further, changes in temperature at the surface of deflector 50 will lag behind the deflector excitation current. Therefore, temperature of the pole pieces 40 cannot be inferred or computed with sufficient accuracy from deflector excitation currents. By the same token, indirect measurement of the temperature of pole pieces 40 from measurement of the temperature of deflector 50 is inherently inaccurate due to at least the thermal mass of the pole piece and the corresponding time lag of the pole piece temperature response.

Accordingly, the invention provides for direct measurement of temperature of pole piece 40, preferably with a resistive-thermal device (RTD) 60, or a thermistor, mounted directly on or in the pole piece or closely proximate thereto. The mounting arrangement is not particularly critical to the practice of the invention and numerous suitable techniques providing good thermal communication from the pole pieces to the RTD are known. Similarly, the location of the RTD on the pole pieces is not particularly critical but should be chosen in consideration of providing a short thermal path from the pole piece gap 55 to the RTD while limiting direct radiative and/or conductive heating of the RTD.

The analog output of the RTD 60 is preferably provided to an analog-to-digital converter 70 since digital computation of a correction by a digital computer is currently preferred for convenience in implementing or changing potentially irregular and/or complex correction functions. On the other hand, the inventors have discovered that the required correction for temperature-dependent variation of focus is substantially linear, in which case, analog computation of the correction by a relatively simple difference amplifier circuit may be convenient and signal conversion at 70 would not be required. Accordingly, the illustration of a computation arrangement 80 should be considered as being generic to both analog and digital techniques.

The exemplary focus correction function for correcting the strength of the lens can thus be generally expressed as $F=F_{(nominal)}+K\Delta T+$ offset where T is the temperature of the pole piece and K and offset are the empirically determined slope and offset terms for focus coil 100. These values are determined by evaluating optimal focus of features exposed in a resist (or evaluated electronically as a function of pole piece temperature. It should be recognized that $F_{(nominal)}$ may, itself, be a function of deflection (e.g. field curvature) and/or correction due to target height variation.

However, it should be understood that correction functions for other temperature-dependent effects or aberrations (e.g. beam deflection, astigmatism and the like) may not be linearly dependent on temperature and it may be convenient to provide empirically derived correction values in a look-up table or the like, particularly if a complex computation cannot be accomplished with sufficient speed for real-time correction. Correlation between temperature of a magnetic optical element and an associated aberration can be accommodated and correction provided. It will be appreciated by those skilled in the art in view of the foregoing description of the invention that correction of nominal excitation current values can be derived and applied, as may be desired, to many types of electron optical element such as lenses, stigmators, deflectors and focus coils that exhibit any temperature dependency.

The corrected value of excitation current so derived is supplied, in the case of a temperature dependent lens, to a low-inductance focus coil 100 or other single or multiple coil arrangements having low hysteresis such that the drive current can be altered rapidly. Such a low-inductance coil is generally provided for focus correction or adjustment with deflection to correct for field curvature and is entirely adequate for practice of the invention since temperature changes requiring correction occur over longer time periods than the interval between sequential exposures for which focus adjustment may also be made. In the case of electron optical elements, such as deflectors, which are capable of producing a rapidly changing field, the corrected nominal excitation current can be directly applied thereto. In the case of stigmators, which are quadrupole devices, correction may be made for the entire stigmator, each pair of poles and/or individual poles as may be found necessary.

The closed loop focus correction for temperature dependencies can be superimposed or one or more such coils. The location of such coil or coils is not critical to the practice of the invention although it will be understood by those skilled in the art in view of this description of the invention that the efficiency of the correction may vary with location of the coil or coils along the charged particle column.

In view of the foregoing, it is seen that the invention provides correction and/or compensation for many temperature-dependent changes in performance through direct temperature measurement and closed loop feedback dynamic aberration control. Additionally, since corrections for temperature-dependent effects are provided, greater flexibility in design and choice of materials for the elements and their relative positioning and proximity is made possible for deriving improved performance of the charged particle beam tool or system, such as reducing the length of the charged particle beam column to reduce Coulomb interactions. Moreover, since many temperature dependencies can be corrected by use of the invention, constraints on relative positioning of electron optical elements are eased, allowing reduction of the length of the electron beam column to reduce effects of Coulomb interactions and associated e-beam tool design trade-offs.

While the invention has been described in terms of a single preferred embodiment, those skilled the art will recognize that the invention can be practiced with modification within the spirit and scope of the appended claims.

Having thus described our invention, what we claim as new and desire to secure by Letters Patent is as follows:

1. A charged particle beam system including
   a magnetic element having a pole piece for controlling a charged particle beam,
   a temperature sensor located closed proximate to said pole piece to measure the temperature thereof,
   means for deriving a correction of a nominal value of excitation current for said magnetic element, and
   means for applying a correction excitation current to said magnetic element, said correction excitation current corresponding to said correction of said nominal value of excitation current.

2. A system as recited in claim 1, wherein said temperature sensor is a thermistor.

3. A system as recited in claim 1, wherein said temperature sensor is a resistive-thermal device.

4. A system as recited in claim 1, wherein said magnetic element includes
   a lens, and
   a focus coil, wherein said correction excitation current is applied to said focus coil.

5. A system as recited in claim 1, wherein said magnetic element comprises a lens and a stigmator wherein said correction excitation current is applied to said stigmator.

6. A system as recited in claim 1, wherein said magnetic element comprises a lens and a deflector wherein said correction excitation current is applied to said deflector.

7. A system as recited in claim 1, wherein said means for deriving a correction of a nominal value of excitation current includes a look-up table.

8. A system as recited in claim 1, wherein said means for deriving a correction of a nominal value of excitation current includes a difference amplifier.

9. A system as recited in claim 1, wherein said means for deriving a correction of a nominal value of excitation current includes a means for digitally computing a correction function.

10. A system as recited in claim 9, wherein said correction function is a linear function of temperature.

11. A system as recited in claim 1, wherein said charged particle system is an electron beam system.

12. A system as recited in claim 1, wherein said charged particle system is an electron beam lithography tool.

13. A system as recited in claim 1, wherein said charged particle system is an electron beam projection lithography tool.

14. A charged particle beam system as recited in claim 1, wherein said magnetic element is an electromagnetic element, and said correction of said nominal value of correction current compensates for temperature dependent changes in dimensions or permeability of said pole piece.

15. A method of operating a charged particle beam system including a magnetic element having a pole piece that exhibits changes in permeability with changes in temperature, said method comprising steps of locating a temperature sensor closely proximate to said pole piece measuring temperature of said pole piece, and correcting a nominal excitation current of said magnetic element of said charged particle beam system in accordance with a correction value corresponding to said temperature to obtain a correction excitation current.

16. A system as recited in claim 15, wherein said charged particle system is an electron beam system.

17. A system as recited in claim 15, wherein said charged particle system is an electron beam lithography tool.

18. A system as recited in claim 15, wherein said charged particle system is an electron beam projection lithography tool.

19. A method as recited in claim 15, including the further step of retrieving said correction value forth a look-up table.

20. A method as recited in claim 15, including the further step of computing said correction value from a correction function.

21. A method as recited in claim 15, wherein said correcting step is performed with a difference amplifier.

22. A method as recited in claim 15, wherein said magnetic element comprises a lens and a focus coil and wherein said correction excitation current is applied to said focus coil.

23. A method as recited in claim 15, wherein said magnetic element comprises a lens and a stigmator and wherein said correction excitation current is applied to said stigmator.

24. A method as recited in claim 15, wherein said magnetic element comprises a lens and a deflector and wherein said correction excitation current is applied to said deflector.

25. A method as recited in claim 15, wherein said magnetic element is an electromagnetic element, and said step of correcting said nominal excitation current compensates for temperature dependent changes in dimensions or permeability of said pole piece.

* * * * *